United States Patent [19]

Lam

[11] 4,323,417
[45] Apr. 6, 1982

[54] METHOD OF PRODUCING MONOCRYSTAL ON INSULATOR

[75] Inventor: Hon W. Lam, Dallas, Tex.

[73] Assignee: Texas Instruments Incorporated, Dallas, Tex.

[21] Appl. No.: 147,408

[22] Filed: May 6, 1980

[51] Int. Cl.$^3$ ............................................. C30B 19/00
[52] U.S. Cl. ..................................... 156/613; 156/624; 156/DIG. 80; 156/DIG. 105
[58] Field of Search ......... 156/612, 613, 614, DIG. 80, 156/DIG. 102, DIG. 88, DIG. 64, DIG. 105; 148/115, 171; 427/86; 428/446

[56] References Cited

U.S. PATENT DOCUMENTS

| | | | |
|---|---|---|---|
| 3,585,088 | 6/1971 | Schwuttke et al. | 156/DIG. 80 |
| 3,600,237 | 8/1971 | Davis et al. | 156/DIG. 88 |
| 3,996,094 | 12/1976 | Lesk | 156/DIG. 88 |
| 4,059,461 | 11/1977 | Fan et al. | 156/DIG. 80 |

FOREIGN PATENT DOCUMENTS

| | | | |
|---|---|---|---|
| 51-99971 | 9/1976 | Japan | 156/DIG. 64 |

OTHER PUBLICATIONS

Tamura et al., Japanese Journal of Applied Physics, v 19, No. 1, Jan. 1980, pp. 23-26.

*Primary Examiner*—Hiram Bernstein
*Attorney, Agent, or Firm*—Robert Groover, III; Melvin Sharp; James T. Comfort

[57] ABSTRACT

A method for producing monocrystal on insulator is disclosed. Initially, an epitaxial layer is created on the single crystal substrate. This epitaxial layer may be formed by direct deposition of the monocrystal layer, or through epitaxial monocrystal growth induced after a polycrystal or amorphous layer has been deposited upon the substrate. By appropriately scanning a laser or other focused energy source beginning at some point within the epitaxial layer, and moving into the polycrystalline or amorphous layer over the insulator region, the polycrystalline or amorphous layer will melt, then upon resolidifying it will be monocrystal in structure due to its monocrystal neighbor, the epitaxial layer.

9 Claims, 6 Drawing Figures

METHOD OF PRODUCING MONOCRYSTAL ON INSULATOR

BACKGROUND

Little background exists on producing monocrystal on insulator. Two approaches have been tried without much success. Both approaches, as does this invention, are performed on an insulator region formed on or in a single crystal substrate, usually silicon.

One approach is to mechanically place a crystalline seed on an insulator region, such as oxide, and then to thermally grow this crystalline seed. In this approach, there is the paramount problem of properly setting the seed so that the subsequent growth is of the correct alignment.

Another approach is to deposit a layer over the entire body and then to induce throughout the deposited layer monocrystalline growth using a pulsed laser. Although this approach does produce an epitaxial layer in the region of the deposited layer directly on the single crystal substrate, any extended growth over the insulator region will be either polycrystalline or amorphous in nature. This results from the impossibility of obtaining the appropriate uniform heat level throughout the deposited crystalline layer due to the differing thermal conductivity of the single crystal substrate and the insulator. This approach is discussed at length by Masao Tamura, Hiroshi Tamura and Takasi Tokuyama in "Si Building Epitaxy From Si Windows onto $SiO_2$ by Q-Switched Ruby Laser Pulsed Annealing", Japanese Journal of Applied Physics, Vol. 19, No. 1, Jan., 1980, p. L23-26.

Clearly, neither approach produces the desired result of monocrystal on insulator combination. The monocrystal on insulator combination is an ideal basis for construction of semiconductor devices and circuits since it provides a region of insulation beneath the monocrystal to protect against device to device communication. Additionally, the insulator region allows denser packing of devices, higher speed capability, reduced susceptibility to latchup, and reduced susceptibility to ionizing radiation.

SUMMARY OF THE INVENTION

This inventive method is performed on a single crystal substrate which has formed on or in it an insulator region. The single crystal substrate may be of any crystalline material, such as, but not limited to silicon. Formation of an insulator region includes either depositing the insulator region onto the single crystal substrate, or growing an insulator region within the single crystal substrate itself. One example of a suitable insulator is an oxide of the substrate material.

An epitaxial layer is then developed over the single crystal substrate. This epitaxial layer may be developed either by direct vapor deposition of monocrystal material, or afterwards, utilizing methods known to those in the art such as liquid phase epitaxy. The remaining portion of the deposit, overlying the insulator, may be either polycrystalline or amorphous in nature.

Extension of the monocrystalline structure of the epitaxial layer is accomplished through some focused energy source such as a constant wave laser. By focusing a narrow beam of the laser on some region of the epitaxial layer and then scanning the focused laser into the polycrystalline or amorphous layer, the laser causes the polycrystalline or amorphous layer to melt. On resolidifying, the layer will take on a monocrystalline shape due to its monocrystalline neighbor, the epitaxial layer; hence, a monocrystal on insulator is produced.

The scanning of the focused laser must be performed from the monocrystal epitaxial layer into the polycrystal or amorphous layer. The actual angle of entry of the scan into the polycrystal or amorphous layer is immaterial; it was found, however, that when the scan was parallel to the interface of two layers, the overlap had to be greater than 50% of the beam width. A scan perpendicular to the interface was tried and found successful.

Although the discussion above referenced use of a laser, other means for melting may be used such as an electron beam without losing the concept or spirit of the invention.

The invention will be further illustrated by the following figures and their accompanying descriptions.

FIGURES

Figure 1A:
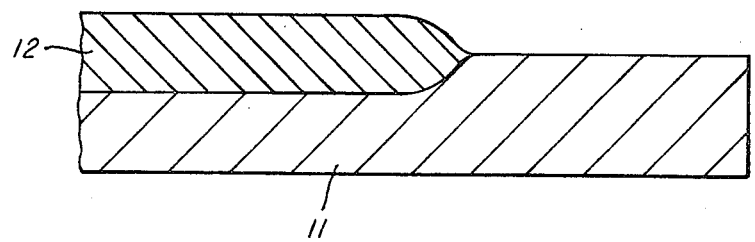
FIGS. 1a, 1b, 2, 3a and 3b are sequential cross sections of the single crystal substrate having an insulator region therein and the transformation it experiences utilizing this inventive method.

Specifically, in FIG. 1a, the single crystal substrate 11 has insulator region 12 grown in it. An example of a suitable single crystal substrate is monocrystalline silicon. By way of illustration only, the insulator region formed may be silicon oxide grown within the single crystal substrate.

Although FIG. 1a illustrates the initial form where the insulator region is grown within the single crystal substrate, the insulator region may be deposited onto the substrate and the inventive method will be as effective on this alternate initial form.

Figure 1B:
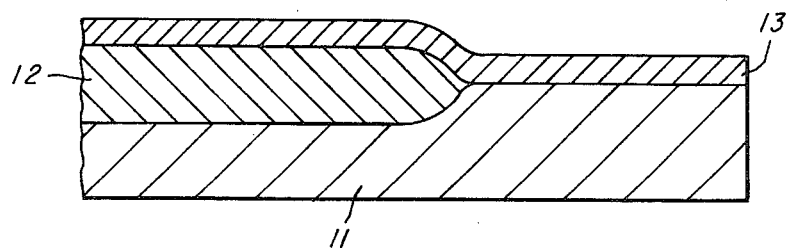

FIG. 1b illustrates a deposited layer 13 which is placed over the single crystal substrate 11 and insulator region 12.

Figure 2:
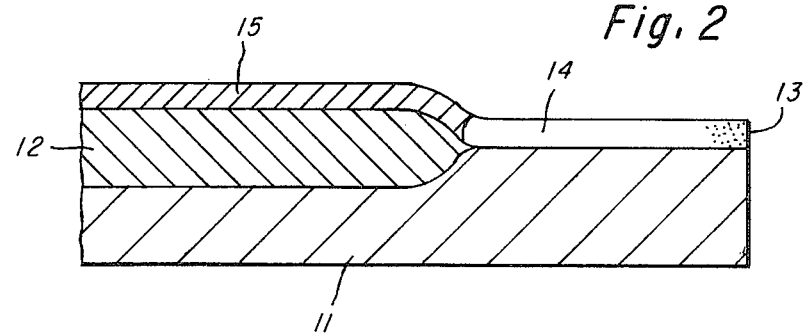

In FIG. 2, two layers within the deposited layer 13, epitaxial layer 14 above the single crystal substrate 11 and a polycrystalline or amorphous layer 15 above the insulator region 12 have been formed by inducing epitaxial growth in the deposited layer 13 above the single crystal substrate 11.

In the preferred embodiment, the epitaxial layer is created and the layer of material is deposited simultaneously. FIG. 2 then illustrates the first process of the preferred embodiment, deleting the need for the steps illustrated in FIGS. 1a and 1b.

Figure 3A:
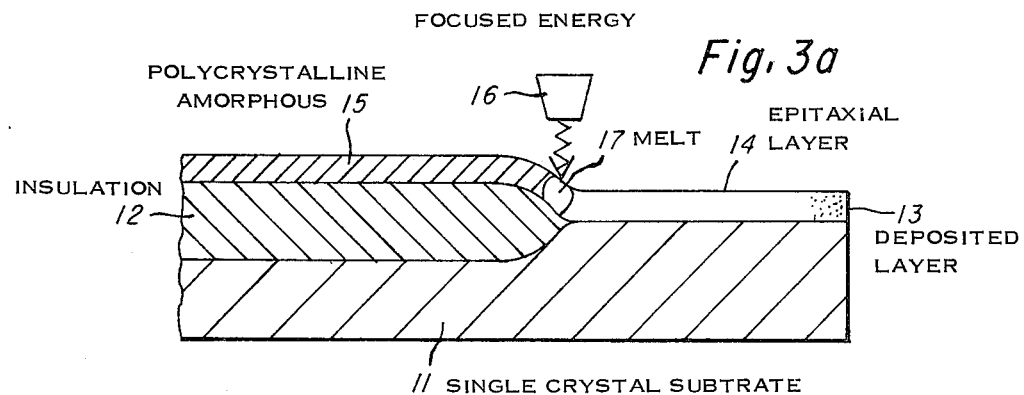

In FIG. 3a, focused energy source 16 is directed at the interface of epitaxial layer 14 and the polycrystalline or amorphous layer 15 creating a melted region 17. Examples of focused energy source 16 are laser beams or electron beams. Although the interface is melted here, any region within the epitaxial layer 14 may be melted as a starting point.

Figure 3B:
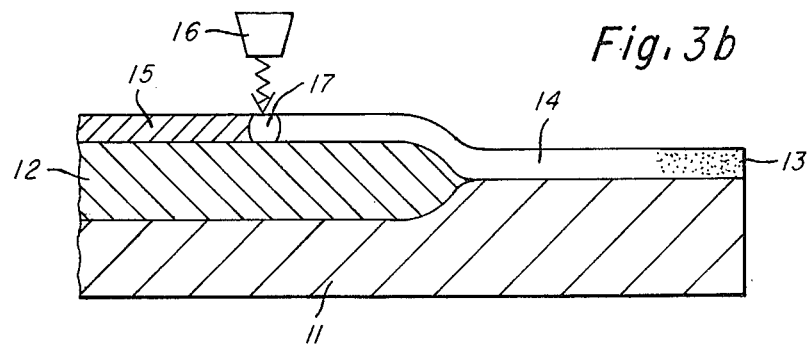

FIG. 3b illustrates the stage of development where the focused energy source 16 has scanned partially into the polycrystalline or amorphous layer 15 permitting the previously melted region behind it to resolidify along the lines of the epitaxial layer 14 creating a monocrystal; thus, monocrystal is extended over the insulator region 12.

Figure 4:
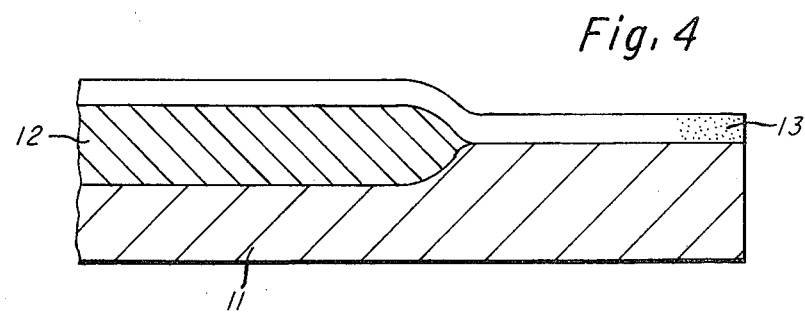
FIG. 4 is a cross section of the completed single crystal on insulator.

In FIG. 4, the entire layer 13 has been converted to contain only monocrystal. This is the desired final form, a monocrystal on insulator.

This inventive method was implemented on a single crystal silicon substrate with silicon oxide insulator approximately one micron in thickness grown on a region of the substrate. Through low pressure chemical vapor deposition, a polycrystalline silicon layer about ½ micron thick was deposited over the entire body.

Through the use of a constant wave laser focused with a spot diameter of about 50 microns, epitaxial growth was induced in the deposited polycrystalline silicon above the substrate, reforming this region of the deposited layer into an epitaxial layer. Nine watts of power was provided to the laser and the substrate was held at 350° C. The laser was then scanned into the polycrystalline silicon layer about ½ centimeter. During this scan the polycrystalline layer was melted. On resolidifying, the melted polycrystal became monocrystal.

Through this method, monocrystalline growth was induced about 30 microns over the insulator region.

What is claimed is:

1. A method for producing monocrystal on insulator comprising the steps of:
   (a) depositing a layer of material on a surface of a single crystal substrate having an insulator region formed therein;
   (b) transforming, via epitaxial growth induced above the single crystal substrate, said layer of material into an epitaxial layer overlying the single crystal substrate and a polycrystal or amorphous layer overlying said insulator region; and,
   (c) scanning a focused energy source, from a starting zone within said epitaxial layer to a stopping zone lying inside the polycrystalline or amorphous layer such that the region of polycrystalline or amorphous layer so scanned is melted, whereby on resolidifying, said scan area will resolidify as monocrystal.

2. A method for producing a monocrystal layer on an insulator surface as claimed in claim 1 wherein said substrate is silicon single crystal.

3. A method for producing a monocrystal layer on an insulator surface as claimed in claim 2 wherein said insulator region is oxide.

4. A method for producing a monocrystal on an insulator surface as claimed in claim 3 wherein the step of depositing the layer of material comprises liquid phase deposition.

5. A method for producing a monocrystal on an insulator surface as claimed in claim 3 wherein the step of depositing the layer of material comprises vapor phase deposition.

6. A method for producing a monocrystal on an insulator surface as claimed in claim 4 wherein the step of epitaxial growth comprises liquid phase epitaxy.

7. A method for producing a monocrystal on an insulator surface as claimed in claim 4 wherein the step of epitaxial growth comprises vapor phase epitaxy.

8. A method for producing a monocrystal on an insulator surface as claimed in claim 6 wherein a laser is utilized as a focused energy source.

9. A method for producing a monocrystal on an insulator surface as claimed in claim 6 wherein an electron beam is utilized as a focused energy source.

* * * * *